(12) United States Patent
Verhaverbeke et al.

(10) Patent No.: US 8,911,554 B2
(45) Date of Patent: Dec. 16, 2014

(54) SYSTEM FOR BATCH PROCESSING OF MAGNETIC MEDIA

(75) Inventors: Steven Verhaverbeke, San Francisco, CA (US); Jose Antonio Marin, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 805 days.

(21) Appl. No.: 12/984,528

(22) Filed: Jan. 4, 2011

(65) Prior Publication Data
US 2011/0163065 A1 Jul. 7, 2011

Related U.S. Application Data

(60) Provisional application No. 61/292,412, filed on Jan. 5, 2010.

(51) Int. Cl.
| | |
|---|---|
| *C23C 16/00* | (2006.01) |
| *C23F 1/00* | (2006.01) |
| *H01L 21/673* | (2006.01) |
| *H01L 21/677* | (2006.01) |
| *G11B 5/84* | (2006.01) |
| *C23C 14/48* | (2006.01) |
| *C23C 14/50* | (2006.01) |
| *H01L 21/687* | (2006.01) |

(52) U.S. Cl.
CPC .............. *G11B 5/8404* (2013.01); *C23C 14/48* (2013.01); *C23C 14/50* (2013.01); *H01L 21/67721* (2013.01); *H01L 21/67736* (2013.01); *H01L 21/67766* (2013.01); *H01L 21/67781* (2013.01); *H01L 21/68771* (2013.01)
USPC ........... 118/719; 118/728; 118/729; 118/730; 118/731; 156/345.31; 156/345.32; 156/345.51

(58) Field of Classification Search
CPC ..................... H01L 21/6715; H01L 21/67167; H01L 21/67; H01L 21/67703; H01L 21/67718; H01L 21/67742; H01L 21/687; H01L 21/68707; H01L 21/68728; H01L 21/68768
USPC ........ 118/719, 728–731; 156/345.31, 345.32, 156/345.51, 345.54, 345.55; 414/754, 758, 414/761, 763, 783, 935–941
See application file for complete search history.

(56) References Cited

U.S. PATENT DOCUMENTS 5,743,965 A * 4/1998 Nishimura et al. ........... 118/712
6,139,243 A * 10/2000 Jackson et al. ............... 414/405
(Continued)

FOREIGN PATENT DOCUMENTS

| JP | 2002-517055 A | 6/2002 |
|---|---|---|
| JP | 2008-512810 A | 4/2008 |

OTHER PUBLICATIONS

International Search Report and Written Opinion mailed Jul. 22, 2011, in International Patent Application Serial No. PCT/US11/020234.

*Primary Examiner* — Rakesh Dhingra
*Assistant Examiner* — Benjamin Kendall
(74) *Attorney, Agent, or Firm* — Patterson & Sheridan, LLP

(57) ABSTRACT

A method and apparatus for processing multiple substrates simultaneously is provided. Each substrate may have two major active surfaces to be processed. The apparatus has a substrate handling module and a substrate processing module. The substrate handling module has a loader assembly, a flipper assembly, and a factory interface. Substrates are disposed on a substrate carrier at the loader assembly. The flipper assembly is used to flip all the substrates on a substrate carrier in the event two-sided processing is required. The factory interface positions substrate carriers holding substrates for entry into and exit from the substrate processing module. The substrate processing module comprises a load-lock, a transfer chamber, and a plurality of processing chambers, each configured to process multiple substrates disposed on a substrate carrier.

12 Claims, 11 Drawing Sheets

(56) References Cited

U.S. PATENT DOCUMENTS

| | | | |
|---|---|---|---|
| 6,315,512 B1 * | 11/2001 | Tabrizi et al. | 414/217 |
| 6,729,824 B2 * | 5/2004 | Lei et al. | 414/217 |
| 6,752,585 B2 * | 6/2004 | Reimer et al. | 414/783 |
| 6,852,644 B2 * | 2/2005 | Dickinson | 438/758 |
| 7,134,827 B2 * | 11/2006 | Larson et al. | 414/416.01 |
| 7,140,655 B2 * | 11/2006 | Kesil et al. | 294/104 |
| 7,165,711 B2 * | 1/2007 | Barretto et al. | 228/49.5 |
| 7,270,510 B2 * | 9/2007 | Putzi | 414/226.05 |
| 8,096,744 B2 * | 1/2012 | Okada et al. | 414/217 |
| 8,419,341 B2 * | 4/2013 | Hoey et al. | 414/749.2 |
| 2005/0105991 A1 | 5/2005 | Hofmeister et al. | |
| 2008/0181758 A1 * | 7/2008 | Woodruff et al. | 414/744.5 |
| 2010/0221583 A1 * | 9/2010 | Foad et al. | 428/846 |

* cited by examiner

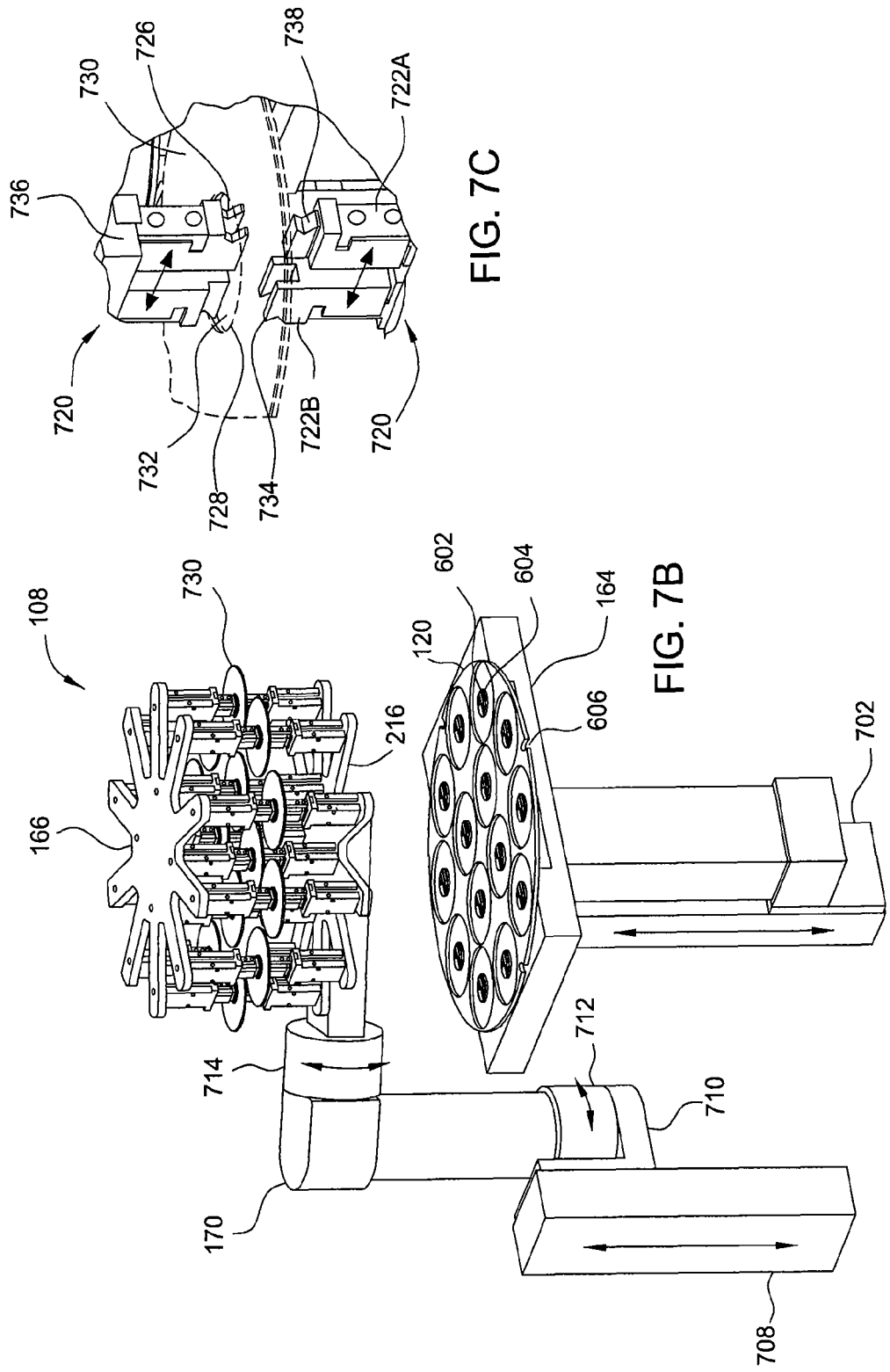

SYSTEM FOR BATCH PROCESSING OF MAGNETIC MEDIA

CROSS-REFERENCE TO RELATED APPLICATIONS

This application claims benefit of U.S. provisional patent application Ser. No. 61/292,412, filed Jan. 5, 2010, which is herein incorporated by reference.

FIELD

Field of the Invention

Embodiments described herein relate to simultaneous processing of multiple substrates, each of which may have two active major surfaces. More specifically, embodiments described herein relate to patterning of magnetic media by plasma exposure.

BACKGROUND

Magnetic media are used in various electronic devices such as hard disk drives and magnetoresistive random access memory (MRAM) devices. Hard-disk drives are the storage medium of choice for computers and related devices. They are found in most desktop and laptop computers, and may also be found in a number of consumer electronic devices, such as media recorders and players, and instruments for collecting and recording data. Hard-disk drives are also deployed in arrays for network storage. MRAM devices are used in various non-volatile memory devices, such as flash drives and dynamic random access memory (DRAM) devices.

Magnetic media devices store and retrieve information using magnetic fields. The disk in a hard-disk drive is configured with magnetic domains that are separately addressable by a magnetic head. The magnetic head moves into proximity with a magnetic domain and alters the magnetic properties of the domain to record information. To recover the recorded information, the magnetic head moves into proximity with the domain and detects the magnetic properties of the domain. The magnetic properties of the domain are generally interpreted as corresponding to one of two possible states, the "0" state and the "1" state. In this way, digital information may be recorded on the magnetic medium and recovered thereafter.

Magnetic storage media generally comprise a glass, composite glass/ceramic, or metal substrate, which is generally non-magnetic, with a magnetically susceptible material between about 100 nm and about 1 μm thick deposited thereon by a PVD or CVD process. In one embodiment, a layer comprising cobalt and platinum is sputter deposited on a structural substrate to form a magnetically active layer. The magnetically susceptible layer is generally either deposited to form a pattern or patterned after deposition, such that the surface of the device has areas of magnetic susceptibility interspersed with areas of magnetic inactivity. By one method, the non-magnetic substrate is topographically patterned, and the magnetically susceptible material deposited by spin-coating or electroplating. The disk may then be polished or planarized to expose the non-magnetic boundaries around the magnetic domains. In some cases, the magnetic material is deposited in a patterned way to form magnetic grains or dots separated by a non-magnetic area.

Such methods are expected to yield storage structures capable of supporting data density up to about 1 TB/in$^2$, with individual domains having dimensions as small as 20 nm. Where domains with different spin orientations meet, there is a region referred to as a Bloch wall in which the spin orientation goes through a transition from the first orientation to the second. The width of this transition region limits the areal density of information storage because the Bloch wall occupies an increasing portion of the total magnetic domain.

To overcome the limit due to Bloch wall width in continuous magnetic thin films, the domains can be physically separated by a non-magnetic region (which can be narrower than the width of a Bloch wall in a continuous magnetic thin film). Conventional approaches to creating discrete magnetic and non-magnetic areas on a medium have focused on forming single bit magnetic domains that are completely separate from each other, either by depositing the magnetic domains as separate islands or by removing material from a continuous magnetic film to physically separate the magnetic domains. A substrate may be masked and patterned, and a magnetic material deposited over exposed portions, or the magnetic material may be deposited before masking and patterning, and then etched away in exposed portions. In either case, the topography of the substrate is altered by the residual pattern of the magnetic regions. Because the read-write head of a typical hard-disk drive may fly as close as 2 nm from the surface of the disk, these topographic alterations can become limiting. Thus, there is a need for a process or method of patterning magnetic media that has high resolution and does not alter the topography of the media, and an apparatus for performing the process or method efficiently for high volume manufacturing.

SUMMARY

Embodiments described herein provide a system for processing magnetic media with a substrate handling module that has a substrate carrier with a plurality of substrate support locations, a loader assembly configured to position a substrate on each substrate support location of the substrate carrier, a flipping assembly configured to retrieve the substrates from the substrate carrier, flip them over, and replace them on the substrate carrier, and a factory interface coupled to the loader assembly and the flipping assembly.

The loader assembly has a cassette station and a robot with an end effector configured to engage an edge of a substrate in a cassette on the cassette station and rotate the substrate between a first orientation and a second orientation orthogonal to the first orientation. The substrate carrier moves between the loader assembly and the factory interface on a carrier transport assembly. A substrate processing module is coupled to the factory interface by a load-lock.

The flipper assembly has a stage for positioning one or more substrates to be flipped, a static gripper head comprising one or more grippers, and a dynamic gripper head comprising one or more grippers, wherein the dynamic gripper head is actuated to flip the substrates. The stage is actuated to engage the static gripper head to transfer substrates to the static gripper head. The dynamic gripper head is actuated to engage the static gripper head, retrieving substrates therefrom, to rotate the substrates, and deposit them on the substrate carrier on the stage.

Embodiments described herein also disclose a method of processing substrates having magnetic surfaces by disposing a plurality of substrates on a substrate carrier, performing a plasma process simultaneously on a first side of each substrate disposed on the substrate carrier, flipping the substrates on the substrate carrier simultaneously, and performing a plasma process simultaneously on a second side of each substrate disposed on the substrate carrier. The plasma process performed on each side of each substrate may include a plasma doping process and a plasma stripping process, each of which may be a plasma immersion process.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 7A-7E are detailed views of a flipper assembly of the substrate handling module of FIG. 2A in various configurations.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
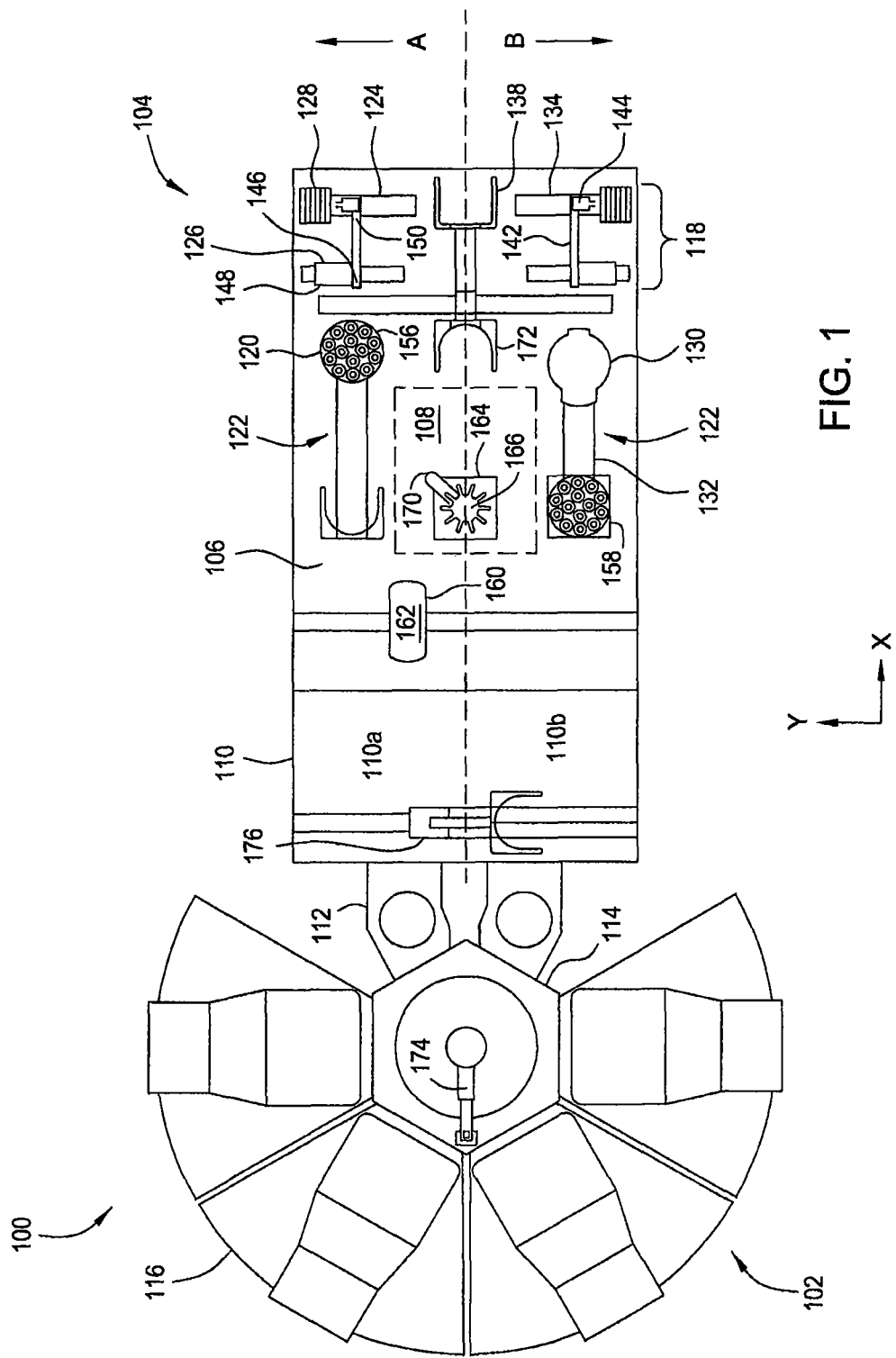
FIG. 1 is a top view of a system for processing magnetic media according to one embodiment.

Embodiments described herein generally provide apparatus and methods for magnetic patterning of magnetic media. FIG. 1 is a top view of a system 100 for processing magnetic media. The system 100 comprises a substrate processing module 102 and a substrate handling module 104 coupled to the substrate processing module 102. The substrate handling module 104 comprises a loader assembly 106, a flipper assembly 108, and a factory interface 110. The substrate processing module 102 has a load-lock 112, a transfer chamber 114, and a plurality of processing chambers 116. The system 100 may be used to process single substrates or multiple substrates simultaneously in one chamber, and may also be used to process substrates on two sides.

The loader assembly 106 comprises a loader 118 configured to place substrates on a substrate carrier 120 for processing in the substrate processing module 102, and a carrier transfer module 122 configured to transfer loaded substrate carriers 120 to and from the factory interface 110. The loader 118 comprises a cassette handling assembly 124 and a substrate placement robot 126 configured to transport individual substrates between a cassette 128 positioned at the cassette handling assembly 124 and a substrate carrier 120 positioned at the carrier transfer module 122. The carrier transfer module 122 comprises a platform 130 coupled to a shuttle that moves the substrate carrier 120 along a linear guide 132 between the loader 118 and the factory interface 110.

The cassette handling assembly 124 comprises a cassette station 134, that holds a plurality of substrate cassettes 128, and a cassette positioner 138. Each of the cassettes 128 is configured to carry a plurality of substrates in a vertical position, "vertical" in this context referring to an orientation orthogonal to the orientation of a substrate disposed on a substrate carrier 120, which may be referred to as a "horizontal" position. The vertical direction is generally aligned along a z-axis of the system 100, and the horizontal plane is generally aligned along a plane formed by the x and y-axes of the system 100.

The substrate placement robot 126 comprises an arm 142, which is a rod-like extension that has a length sufficient for an end effector 144 coupled to the arm 142 to access a cassette 128 at the cassette handling assembly 124. The arm 142 may comprise any material having suitable structural strength, such as plastic or metal. The arm 142 has a first end 146 coupled to an actuator 148 and a second end 150 coupled to an end effector 144. The actuator 148 has at least three degrees of freedom, with at least a linear component and a biaxial rotational component for positioning the end effector 144 to access substrates stored in the vertical position in a cassette 128 or in the horizontal position on a substrate carrier 120, and for moving the substrates between the two locations. The rotational component flips the arm 142 approximately 180° from a position for accessing cassettes 128 to a position for accessing substrate carriers 120. The rotational component also rotates the arm 142 about its longitudinal axis to orient the end effector 144 as needed. The linear component positions the arm 142 and end effector 144 in the y-direction to access cassettes 128 at different locations of the cassette station 134, and to place substrates on different substrate sites of the substrate carrier 120.

Substrate carriers 120 are positioned on the platform 130 of the carrier transfer module 122, and are positioned at a first position 156 of the carrier transfer module 122 for loading and unloading of substrates. Substrate carriers 120 are then moved between the first position 156 and a second position 158 by the shuttle. The shuttle (not visible in the top view of FIG. 1) is a linear actuator, such as a motorized roller assembly, a screw drive coupled to a roller assembly, a gear drive, or similar mechanism, coupled to the linear guide 132 and to the platform 130. The linear guide 132 may be a rail with one or more tracks for coupling to a roller or gear assembly. At the second position 158, a carrier loader 160 engages the shuttle and platform 130 to exchange substrate carriers 120. The carrier loader 160 loads and unloads substrate carriers 120 from the factory interface 110.

The carrier loader 160 generally comprises a substrate carrier surface 162, a rotational actuator, an extension actuator, and positioning actuator below the carrier surface 162 to accomplish the movement modes required for loading and unloading substrate carriers. The extension actuator extends the substrate carrier surface 162 to access the platform 130 and shuttle of the carrier transfer module 122, when the platform is positioned at the second position 158, and the interior of the factory interface 110. The rotational actuator rotates the substrate carrier surface 162 to enable the extension actuator to extend either into the factory interface 110 or into an engagement position with the carrier transfer module 122. The positioning actuator positions the substrate carrier surface 162 to access multiple zones of the factory interface 110 positioned along the y-axis of the system, if desired.

The factory interface 110 positions multiple substrate carriers 120 for entry into or exit from the substrate processing module 122. In one embodiment, the factory interface 110 has an input stage 110a and an output stage 110b, although a single stage may also be used for both input and output. The factory interface 110 may be equipped with gas sources (not shown) for maintaining an inert atmosphere in the interior of the factory interface 110, if desired. The factory interface 110 may also comprise a robot 176 for transferring substrate carriers between the factory interface 110 and the load-lock 112 of the substrate processing module 102.

Substrates requiring two-sided processing may be flipped using the flipper assembly 108. The flipper assembly 108 comprises a stage 164, a static gripper assembly 166, and a dynamic gripper assembly. The dynamic gripper assembly is obscured by the static gripper assembly 166 in the top view of FIG. 1. The stage 164 may be raised and lowered for access either by the static gripper assembly 166 or the dynamic gripper assembly. The static gripper assembly 166 comprises a plurality of grippers for engaging each substrate on a substrate carrier, and for lifting substrates from a substrate carrier and placing substrates on a substrate carrier. The dynamic gripper assembly comprises a plurality of grippers, similar to the static gripper assembly, and a biaxial rotational actuator 170 for flipping substrates over and for moving from an engaged position between the stage 164 and the static gripper assembly 166 to an unengaged position leaving the space between the stage 164 and the static gripper assembly 166 clear.

Each of the grippers comprises a plurality of actuated fingers, made of a material such as plastic or ceramic that will not damage the substrates. The fingers grip a substrate on an outer or inner edge of the substrate. For substrates having an inner opening, the fingers extend into the opening and move outward to engage the edge of the inner opening. More details of the flipper assembly 108 are shown in FIGS. 7A-7E.

The substrate carrier 120 generally comprises a plurality of substrate sites on which substrates may be positioned for simultaneous processing. In one embodiment, the substrate carrier 120 has a flat surface with a plurality of depressions arranged in the flat surface, each depression defining a substrate site. In one embodiment, each depression has a raised portion in a central location of the depression for engaging an opening in a central region of each substrate. A substrate positioned with the central opening of the substrate engaging the raised portion of the substrate site rests above the depressed surface of the substrate carrier, which may be useful for processing substrates having two active major surfaces. When processing magnetic media, for example, it is generally desired that process equipment refrain from contacting either major surface of the magnetic media substrate to avoid damaging the magnetic surfaces formed on both major surfaces thereof.

In one embodiment, the substrate carrier 120 may have one or more conduits disposed therein for delivering a cooling medium to the depression underneath each substrate. The conduits may emerge from the depressed surface, the raised portion, or both. In another embodiment, the substrate carrier may comprise an annular collar that extends from the surface opposite the surface having the substrate sites. The annular collar may be configured to mate with a cathode assembly of a plasma processing chamber, allowing electrical bias of all substrates disposed on the substrate carrier simultaneously during plasma processing.

In the embodiment of FIG. 1, the substrate handling module 104 comprises an input side "A" and an output side "B". The input side "A" of the substrate handling module 104 generally prepares and positions substrate carriers bearing substrates for entry into the substrate processing module 102. Substrates are moved from a cassette 128 to a substrate carrier on the carrier transfer module 122, and the substrate carrier is transferred to the factory interface 110 and into the substrate processing module 102. The output side "B" of the substrate handling module 104 retrieves substrate carriers bearing substrates from the substrate processing module 102 via the factory interface 110, transfers the substrate carriers to an unloading position via the carrier transfer module 122, and unloads the substrates into an empty cassette 128 at the cassette station 134. Empty substrate carriers are repositioned on the input side "A" of the substrate handling module 104 by a carrier recycle robot 172.

In alternate embodiments, the substrate handling module 104 may have a plurality of trains, each train having a loader assembly 106 and a factory interface 110. In a multi-train embodiment, a single flipper assembly 108 may be used to flip substrates, or multiple flipper assemblies may be interspersed among the trains. The cassette positioner 138 and carrier recycle robot 172 may be used to operate more than two trains by extending the range of motion thereof, or multiple cassette positioners 138 and carrier recycle robots 172 may be deployed. Likewise, the carrier loader 160 and transfer robot 176 may be extended to interface with multiple trains, or reproduced as desired. The number of substrate handling trains devoted to a single processing module 102 will depend on production rates achieved in the processing module 102 and rates of substrate handling achievable with a single train. The load-lock 112 may be configured to house multiple substrate carriers in each chamber as well, depending on the needs of particular embodiments.

Additionally, each train may operate only in input mode, only in output mode, or alternately in input and output mode, depending on the needs of specific embodiments. In the example described above where a given two-train embodiment has an A side and a B side, the A side may be the input side and the B side the output side for a first production campaign, and then the sides may switch operating modes. This may be useful in the event operation of the processing chambers in the processing module, as described further below, is reconfigured.

The substrate processing module has a load-lock 112, a transfer chamber 114, and a plurality of processing chambers 116, each of which is configured to process substrates disposed on a substrate carrier. The load-lock 112 has one or more load-lock chambers, and may also have an interface robot 176 for transferring substrate carriers between the factory interface 110 and a load-lock chamber, if the factory interface 110 has no such robot.

The transfer chamber 114 has a robot 174 that transfers substrate carriers bearing substrates to be processed between the load-lock chambers and the processing chamber 116. In general, the load-lock 112, transfer chamber 114, and processing chamber 116 operate under vacuum. In one embodiment, the processing chambers 116 include at least one plasma processing chamber configured to perform a plasma immersion ion implantation process simultaneously on all substrate disposed on a substrate carrier. One example of a plasma processing chamber that may be used for such processing is a P3i™ chamber available from Applied Materials, Inc., of Santa Clara, Calif. Such chambers are available with the CENTURA® platform, also available from Applied Materials, Inc., of Santa Clara, Calif.

In operation, a cassette such as the cassette 128 is loaded with substrates to be processed. The substrates are disposed in a vertical position in the cassette 128. The cassette 128 is positioned at the cassette station 134 on the input side "A" of the substrate handling module 102. The substrate placement robot 126 maneuvers to engage the end effector 144 with a substrate on the cassette 128. The substrate placement robot 126 then maneuvers to place the substrate on a substrate site of a substrate carrier 120 positioned at the first position 156 on the platform 130 of the carrier transfer module 122. The substrate placement robot 126 may repeat this cycle of maneuvers until all substrate sites on the substrate carrier are filled. The end effector 144 may be similar to, or the same as, the grippers 720 described below.

The substrate carrier 120 is then moved from the first position 156 to the second position 158 of the carrier transfer module 122 by operation of the shuttle. The carrier loader 160 then rotates into position facing the carrier transfer module 122 and extends to engage with the shuttle of the carrier transfer module 122. The substrate carrier 120 is transferred to the carrier loader 160, which then retracts, rotates approximately 180°, and extends to deposit the substrate carrier 120 loaded with substrates into the factory interface 110.

The robot 176 disposed between the factory interface 110 and the load-lock 112 transfers the substrate carrier 120 from the factory interface 110 to a load-lock chamber of the load-lock 112 for processing. The load-lock chamber equalizes pressure with the transfer chamber 114, which is generally less than about 100 Torr for most vacuum processes. The transfer robot 174 retrieves the substrate carrier 120 loaded with substrates and deposits the substrate carrier 120 in a processing chamber 116 of the substrate processing module 102. The processing chambers 116 of the substrate processing module 102 comprise at least one plasma processing chamber, which may be a plasma immersion ion implant chamber, a plasma material removal chamber, a plasma cleaning chamber, or a plasma resist removal chamber.

When processing is complete, the transfer robot 174 deposits the substrate carrier 120 in a load-lock chamber of the load-lock 112. The robot 176 transfers the substrate carrier 120 from the load-lock 112 to the factory interface 110.

If the substrates are to be processed on two sides, the carrier loader 160 extends to retrieve the substrate carrier 120 from the factory interface 110, retracts, rotates 180°, moves along the y-axis of the system 100 to a position opposite the flipper stage 164, and extends to deposit the substrate carrier 120 on the stage 164. The stage 164 moves upward to engage the static gripper assembly 166, which is used to retrieve substrates from the substrate carrier 120 on the stage 164 or replace substrates on the substrate carrier 120. The dynamic gripper assembly engages the static gripper assembly 166 and the stage 164, rotating about an axis parallel to the plane defined by the surfaces of the substrates being flipped. The grippers of the dynamic and static gripper assemblies are configured to engage an edge of the substrate simultaneously so the dynamic gripper assembly and the static gripper assembly 166 may transfer substrates directly. A gripper of the dynamic gripper assembly and a gripper of the static gripper assembly 166 simultaneously engage an edge of the substrate to accomplish the transfer.

The carrier loader 160 extends to retrieve the substrate carrier 120 having the flipped substrates thereon, retracts, rotates 180°, moves along the y-axis of the system 100 to a position opposite the factory interface 110, and extends to deposit the substrate carrier 120 having the flipped substrates in the factory interface 110. The robot 176 transfers the substrate carrier 120 to a load-lock chamber of the load-lock 112, and the transfer robot 174 transfers the substrate carrier from the load-lock 112 to the processing chambers 116 for processing.

When processing of the flipped substrates is complete, the transfer robot 174 transfers the substrate carrier 120 to a load-lock chamber of the load-lock 112. The robot 176 transfers the substrate carrier to the factory interface 110 on the output side "B" of the system 100. The carrier loader 160 moves along the y-axis of the system 100 opposite the factory interface 110 on the output side "B" of the system 100, extends to retrieve the substrate carrier from the factory interface 110, retracts, rotates 180°, and extends to deposit the substrate carrier on the platform 130 of the carrier transfer module 122, positioned in the second position 158 thereof.

The shuttle of the carrier transfer module 122 moves the substrate carrier 120 from the second position 158 to the first position 156 for access by a substrate placement robot 126. It should be noted that more than one substrate placement robot 126 may be used, if desired, to match throughput of the substrate handling module 104 with throughput of the substrate processing module 102. The substrate placement robot 126 maneuvers to retrieve horizontally positioned substrates from the substrate carrier 120 and deposit them in a vertical orientation in an empty cassette 128 positioned at the cassette station 134.

FIG. 2A is an isometric view of the substrate handling module 104 of the system 100 of FIG. 1. The loader 118 of the substrate handling module 104 further comprises two cassette loaders 222 for the "A" and "B" sides of the substrate handling module 104. Fingers 228 projecting from the cassette loader 222 engage with support surfaces 230 of a cassette 128 to move the cassette 128 between the cassette station 134 and a location external to the system 100, such as a factory automation system or a cassette stage (not shown).

The cassette station 134 further comprises a plurality of substrate lifters 224, each of which extends through a cassette 128 in the z-direction to lift the substrates out of the cassette 128 for access by the substrate placement robot 126. FIG. 2B is a detailed view of a substrate lifter 224 engaging a cassette 128 to lift substrates out of the cassette 128. The substrate lifter 224 has a rack 236 with a plurality of dividers 232 that extend between substrates disposed in the cassette 128 to maintain the substrates in an upright configuration as the lifter 224 extends. The lifter 224 extends through an opening 238 in the cassette, and a rounded surface 234 of the lifter 224 contacts the substrates, disengaging them from the cassette 128. The rounded surface 234 of the lifter 224 accommodates the round shape of the substrate, providing a secure movement out of the cassette 128 into position for access by the cassette positioner 138. Referring again to FIG. 2A, the cassette positioner 138 and the carrier recycle robot 172 are both coupled to a y-guide by a linear actuator 218. The cassette positioner 138 is also coupled to a z-actuator 220, as described further in connection with FIG. 4 below.

The carrier transfer module 122 further comprises a shuttle 202 coupled to the platform 130. The shuttle 202 moves the platform 130 between the first position 156 and the second position 158 in the x-direction of the carrier transfer module 122. The shuttle 202 may be a motorized roller assembly coupled to the platform 130, a roller assembly coupled to a screw drive, a gear drive assembly, or any desired linear actuator. The shuttle 202 is coupled to the linear guide 132 to facilitate motion between the first and second positions 156 and 158.

The flipper assembly 108 further comprises a dynamic gripper assembly 216 that engages the static gripper assembly 166. The rotational actuator 170 rotates the dynamic gripper assembly about an axis that extends parallel to the x-y plane, and further comprises a rotational support 214 that provides an axis of rotation along the z-direction for the dynamic gripper assembly 216. Further details of the gripper assembly are described below in connection with FIGS. 7A-7E.

The carrier loader 160 is coupled to a guide 226 by a y-actuator 206. The carrier surface 162 of the carrier loader 160 is coupled to an extension actuator 212 and a rotational actuator 208. The extension actuator 212 extends in the x-y plane to access the carrier transfer module 122, the flipper stage 164, and the factory interface 110. The rotational actuator 208 rotates the carrier surface 162 about an axis along the z-direction to allow access to components of the loader assembly 106 or the factory interface 110. The rotational actuator 208 is further coupled to a z-actuator 204 that positions the carrier surface 162 for access to carriers stored at different levels of the factory interface 110.

Figure 2:
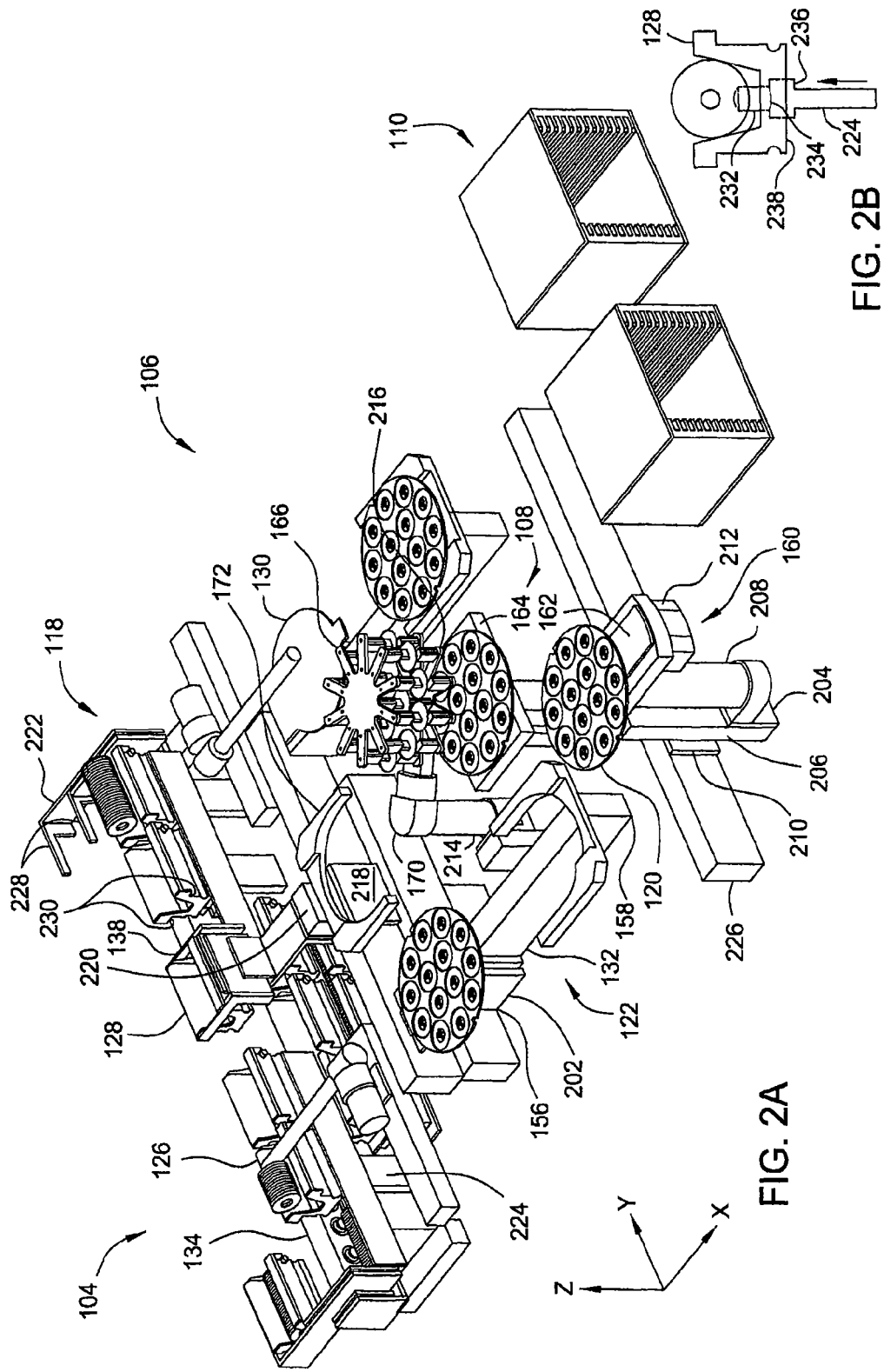
FIG. 2A is an isometric view of a substrate handling module of the system of FIG. 1.
FIG. 2B is a detailed view of a cassette lifter engaging a cassette according to an embodiment.
Figure 3:
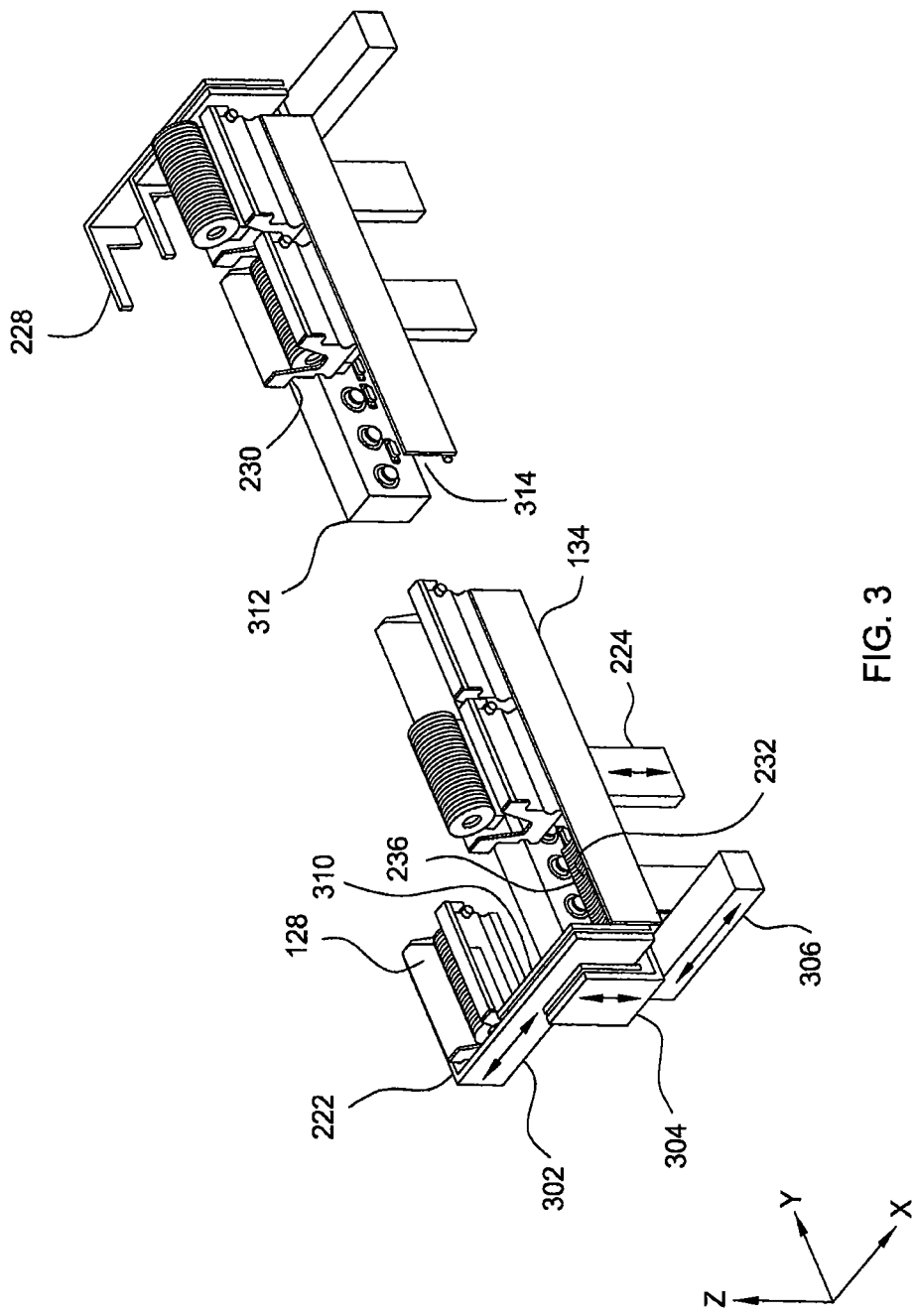
FIG. 3 is a detailed isometric view of a cassette handling assembly of the substrate handling module of FIG. 2A.

FIG. 3 is a detailed isometric view of the cassette handling assembly 124 of the substrate handling module 104 of FIG. 2. The cassette loader 222 comprises a first support 302 and a second support 310, each of which has a finger 228 that engages support surfaces 230 of the cassette 128. The first support 302 moves with respect to the second support 310 to engage the cassette 128. Movement of the first and second supports 302 and 310 is actuated by one or more linear actuators, for example servo motors. The first and second supports 302 and 310 are coupled to a z-actuator 304 and an x-actuator 306, each of which may be a servo motor, for positioning the cassette loader 222.

The cassette station 134 comprises a cassette tray 312 for staging cassettes 128. The cassette tray 312 has an opening 314 that registers with the opening in the cassette (not visible in FIG. 3). The rack 236, with dividers 232, is visible through the opening 314. A plurality of lifters 224 is provided to enable moving full and empty cassettes 128 among the various processing and storage positions provided on the cassette tray 312. The cassette loader (not visible in FIG. 3) may access substrates on one cassette 128 while another cassette 128 is being moved into or out of the module.

Figure 4:
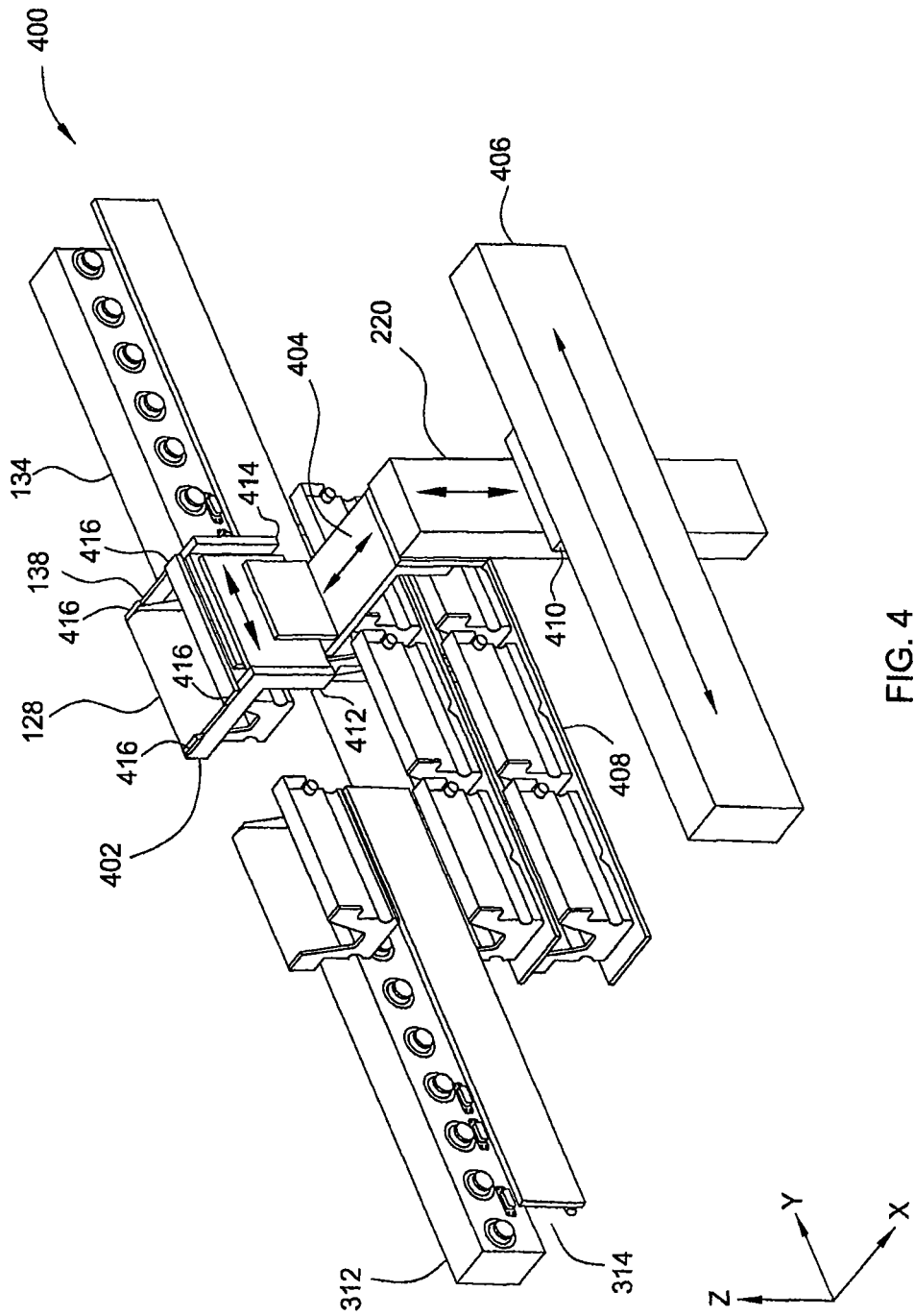
FIG. 4 is a detailed isometric view of a cassette robot assembly of the substrate handling module of FIG. 2A.

FIG. 4 is a detailed isometric view of a cassette robot assembly 400 of the substrate handling module of FIG. 2. The cassette robot assembly 400 comprises the cassette positioner 138 coupled to an x-actuator 404, which is in turn coupled to the z-actuator 220. The z-actuator 220 is coupled to a y-actuator 410, which moves the cassette positioner 138 along the guide 406. The three actuators 404, 220, and 410, each of which may be one or more servo motors, position the cassette positioner 138 in three dimensions to access a cassette 128 on the cassette station 134 or to move a cassette 128 between the cassette station 134 and a cassette storage location 408. The cassette positioner 138 comprises two fingers 402 that engage support surfaces 416 of the cassette 128. A movable portion 412 of the cassette positioner 138 moves with respect to a fixed portion 414 of the cassette positioner 138 to engage the cassette 128. The cassette positioner 138 is generally used to move cassettes from one cassette tray 312 to another or to and from the cassette storage location 408.

Figure 5:
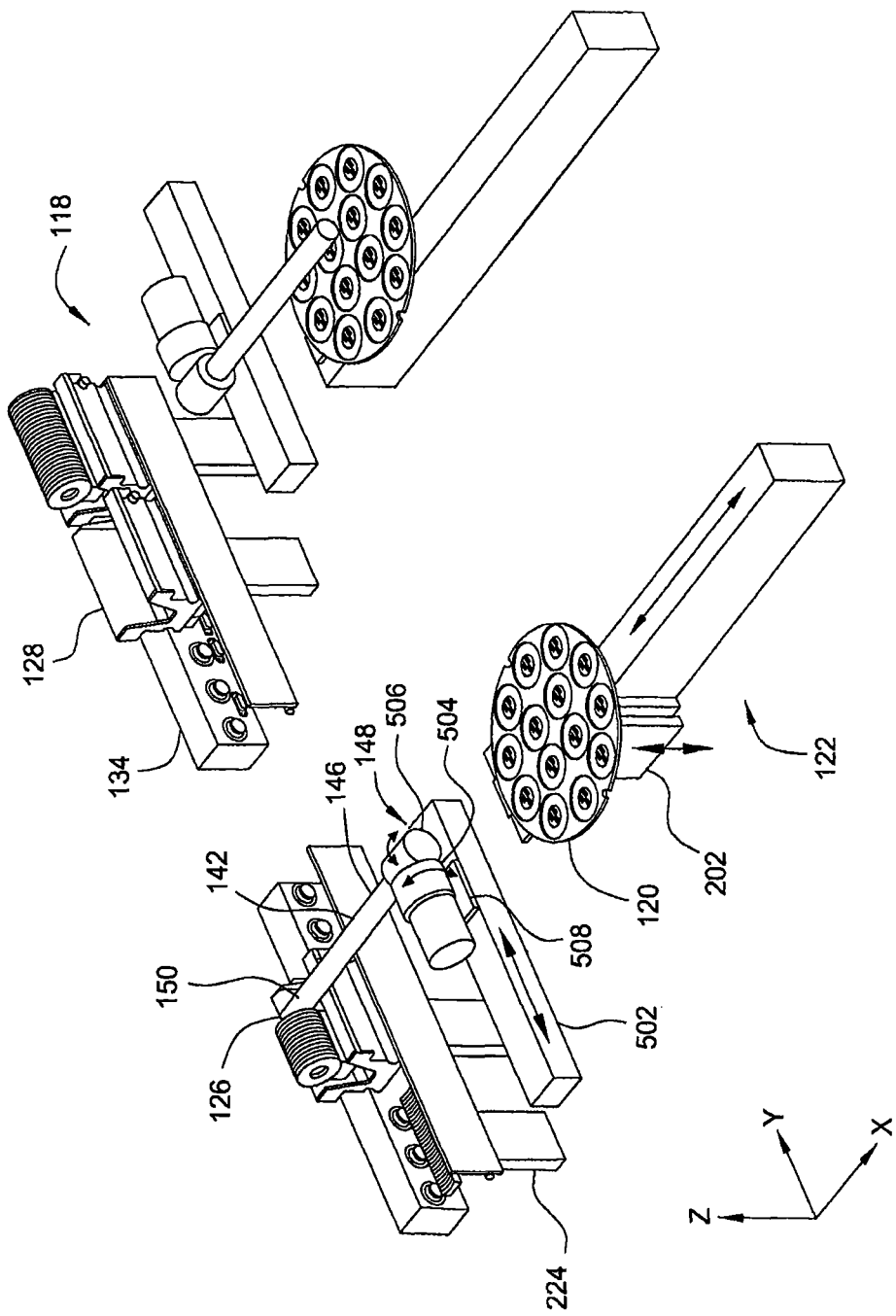
FIG. 5 is a detailed isometric view of a substrate loader of the substrate handling module of FIG. 2A.

FIG. 5 is a detailed isometric view of the substrate loader 118 of the substrate handling module 104 of FIG. 2A. The substrate loader 118 is shown with the carrier transfer module 122 for perspective. The actuator 148 of the substrate placement robot 126 comprises a y-actuator 508, a y-axis rotational actuator 504, and an x-axis rotational actuator 506. The y-actuator 508 moves the substrate placement robot 126 linearly along the guide 502. The y-axis rotational actuator 504 rotates the arm 142 about an axis substantially parallel to the y-axis between a first position for accessing substrates in cassettes on the cassette station 134 and a second position for accessing substrates on a substrate carrier 120 positioned on the carrier transfer module 122. The x-axis rotational actuator 506 rotates the arm 142 and the end effector 144 about an axis substantially parallel to the x-axis between a first position aligned along the y-axis of the system 100 and a second position aligned along the z-axis of the system 100. The three degrees of freedom of the substrate placement robot 126 enable the loader 118 to transfer individual substrates between a z-oriented storage position, which may be a vertical storage position, and an x-y oriented storage position, which may be a horizontal storage position.

The shuttle 202 of the carrier transfer module 122 moves along the x-direction, in coordination with y-direction movement of the loader 118, to position the loader 118 and substrate carrier 120 such that the loader 118 may position substrates at the various substrate sites of the substrate carrier 120. The shuttle 202 of the carrier transfer module 122 also moves in the z-direction by operation of a linear actuator, such as a servo motor, to separate the substrate carrier 120, and substrates disposed thereon, from the loader 118 to ensure motion of the substrate carrier 120 and the loader 118 do not interfere.

Figure 6:
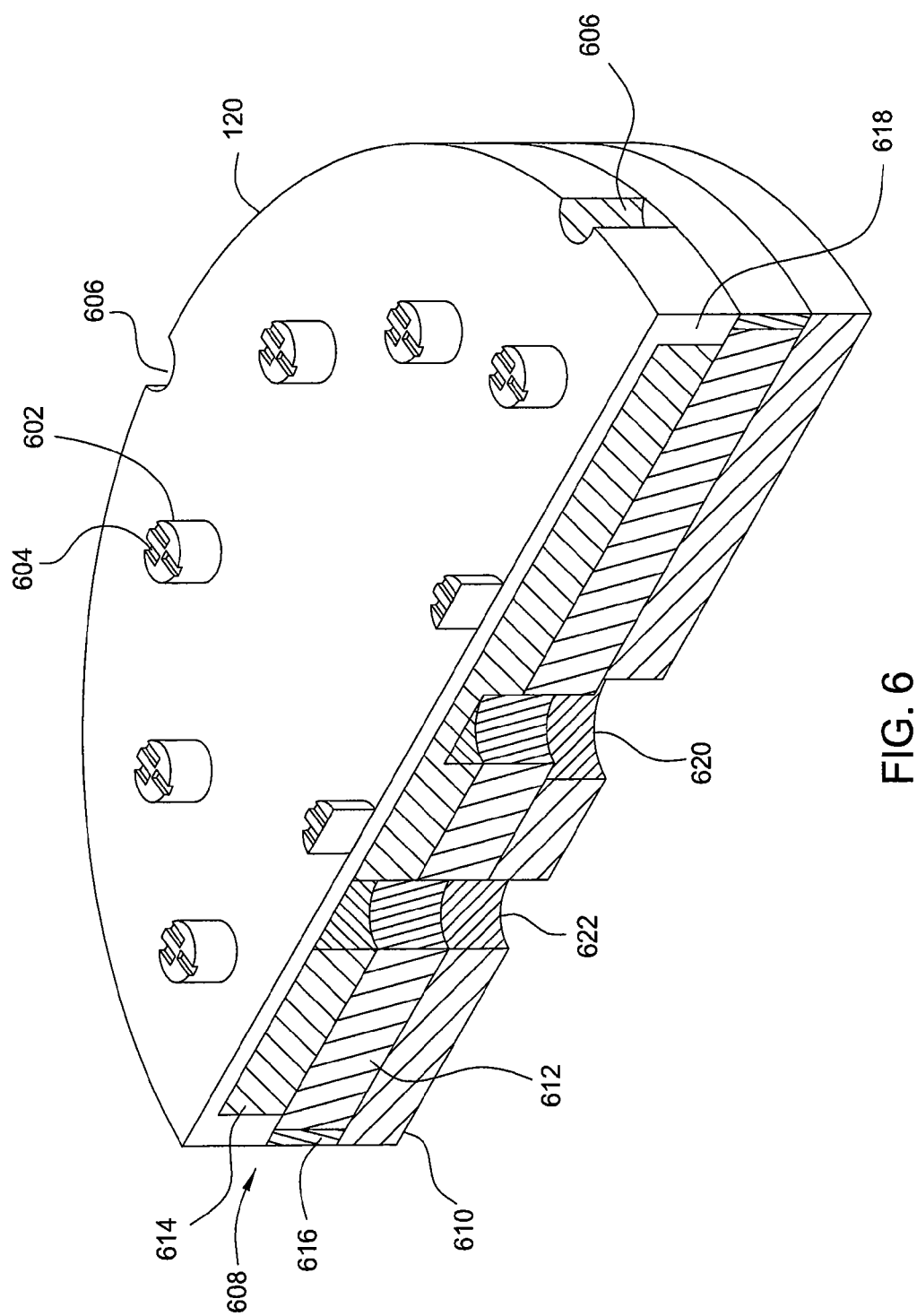
FIG. 6 is a cross-sectional perspective view of a substrate support according to another embodiment.

FIG. 6 is a perspective cross-sectional view of a substrate carrier 120 positioned on a cathode assembly 608 for processing. The substrate carrier 120 comprises a plurality of substrate sites 602, each of which has grooves 604 to allow a gripper, as discussed further in connection with FIGS. 7A-7E below, to engage an inside edge of the substrate. The substrate carrier 120 has a plurality of alignment features 606, which may be recesses or notches of any convenient shape, and allow alignment of the substrate carrier 120 in the substrate handling module 104. Alignment of the substrate carrier 120 facilitates accurate placement of substrates on the substrate carrier 120 by the various robots and actuators of the substrate handling module 104. The cathode assembly 608 comprises a base 610, an insulator 612 on the base 610, and a conductor 614 on the insulator 612. The substrate carrier 120 has an annular extension 618 with inner diameter equal to an outer diameter of the conductor 614. The base 610 is generally a material having structural strength, such as metal or hard plastic. The insulator 612 may be ceramic, hard plastic, or any other dielectric material. The conductor 614 is a conductive material such as metal or conductive polymer. A process kit 616, which generally comprises a dielectric material, is disposed around the insulator 612. The process kit 616 is an annulus having an inner diameter equal to an outer diameter of the insulator 612 and an outer diameter equal to an outer diameter of the base 610 and the substrate carrier 120. A first passageway 622 is provided through the base 610, the insulator 612, and the conductor 614 for a lift mechanism (not shown) to access the underside of the substrate carrier 120 and lift the substrate carrier 120 above the cathode assembly 608 for access by a robot (not shown). A second passageway 620 is provided through the base 610 and the insulator 612, and terminating in the conductor 614, for coupling electrical power to the cathode assembly 608.

Figure 7A:
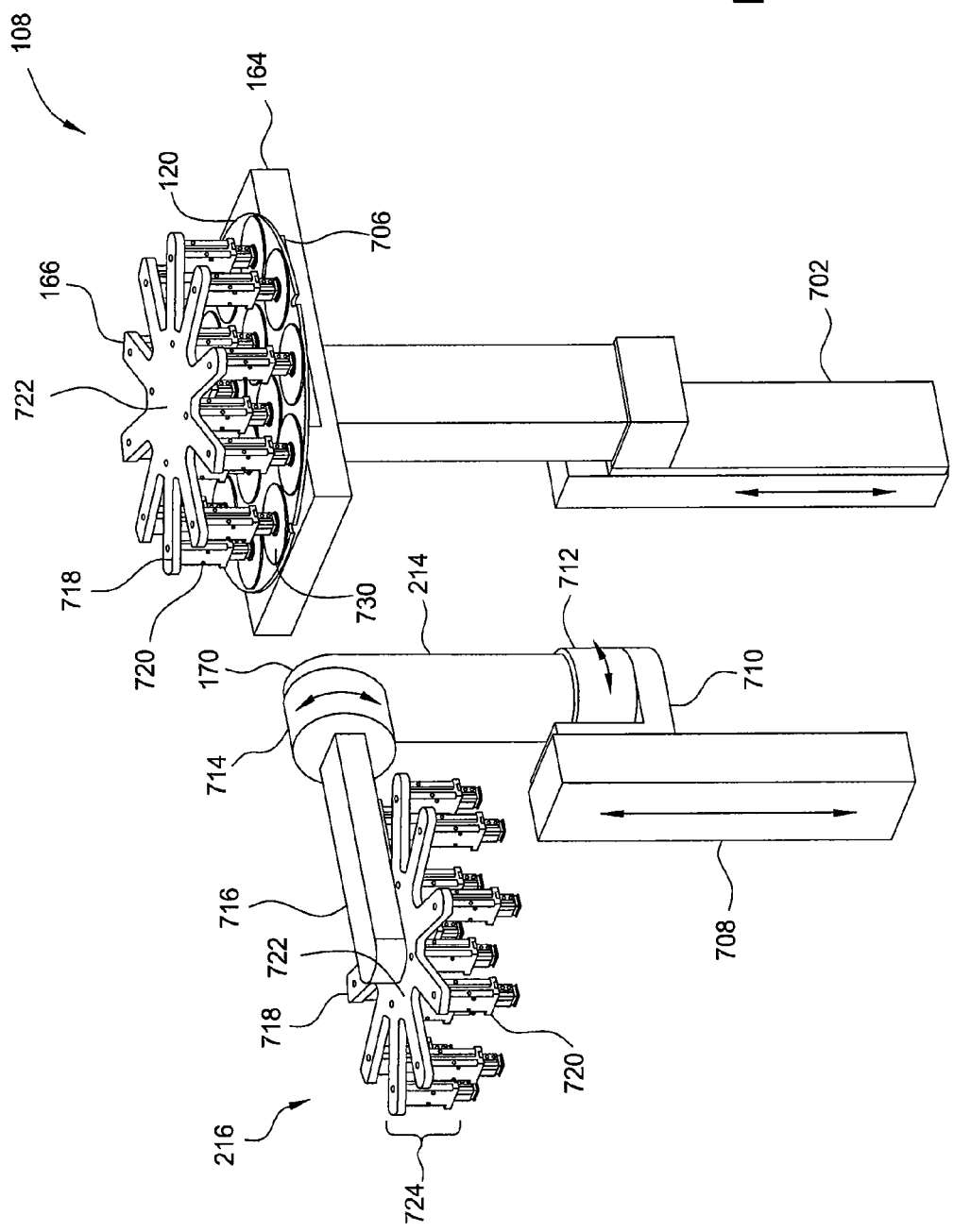
Figure 7E:
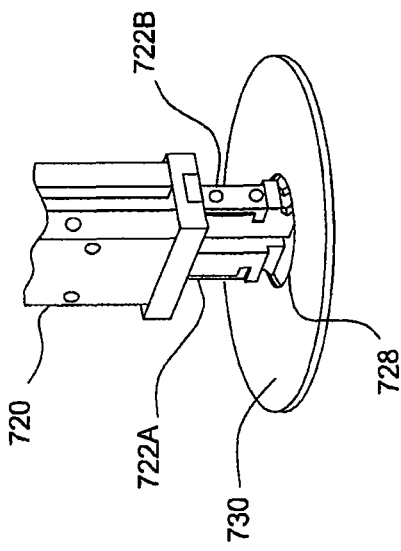

FIG. 7A is a detailed view of the flipper assembly 108 of the substrate handling module 104. The dynamic gripper assembly 216 is shown in a non-engaged position with respect to the static gripper assembly 166. The dynamic gripper assembly 216 has a z-actuator 710 that moves the dynamic gripper assembly 216 along the guide 708. The dynamic gripper assembly 216 also has a z-axis rotational actuator 712 and an x-y rotational actuator 714. The z-axis rotational actuator 712 rotates the dynamic gripper assembly 216 about an axis substantially parallel to the z-axis into a position of engagement with the static gripper assembly 166. The x-y rotational actuator 714 flips the dynamic gripper assembly 216 over to engage alternately with the static gripper assembly 166 or the stage 164 when the stage 164 is lowered to accommodate the dynamic gripper assembly 216 in the engaged position. The z-actuator 710 moves the dynamic gripper assembly 216 closer to the static gripper assembly 166 or to the stage 164 as required.

Each of the dynamic gripper assembly 216 and the static gripper assembly 166 has a plurality of supports 718, each of which supports one or more grippers 720. The supports collectively form a support fixture 722, one each for the static gripper assembly 166 and the dynamic gripper assembly 216. A support fixture 722 and its collection of grippers 720 together define a gripper head 724. The gripper head 724 of the dynamic gripper assembly 216 is attached to a support arm 716, which couples the gripper head 724 to the x-y rotational actuator 714 of the dynamic gripper assembly 216.

The gripper heads 724 of FIG. 7A exhibit a star or asterisk shape, with grippers 720 disposed along the support 718, which radiate like spokes from a central hub region. Some of the supports 718 may support more than one gripper 720, depending on the configuration of substrates on the substrate carrier 120. For example, in the embodiment of FIG. 7A, the support 718 alternately supporting one gripper 720 and two grippers 720. Each support 718 that has only one gripper 720 is between two supports 718, each of which has two grippers 720. Likewise, each support 718 that has two grippers 720 is between two supports 718, each of which has only one gripper 720. Other configurations of gripper heads 724 are contemplated. A gripper head 724 may be a single plate with grippers 720 extending from the plate in one embodiment. In another embodiment, the gripper head 724 may have a plurality of rings with grippers 720 extending from the rings. In other embodiments, the gripper head 724 may have a rectangular or square configuration, with grippers 720 in a square or rectangular grid pattern.

The stage 164 comprises a z-actuator that moves the stage 164 along a guide 702 and enables the stage 164 to engage the static gripper assembly 166 by extending in the z-direction, and then to engage the dynamic gripper assembly 216 by retracting in the z-direction. The stage 164 further comprises a channel 706 that enables the surface 162 of the carrier loader 160 of 2A to extend into the channel 706 to deposit or retrieve a substrate carrier 120 on the stage 164. The stage 164 engages the static gripper assembly 166 to allow the static gripper assembly 166 to retrieve substrates 730 from the substrate carrier 120 disposed on the stage 164.

FIG. 7B shows the flipper assembly 108 in a configuration with the dynamic gripper assembly 216 engaging with the static gripper assembly 166. Substrates 730 are transferred from the static gripper assembly 166 to the dynamic gripper assembly 216 to be flipped when the dynamic gripper assembly 216 is rotated by the x-y rotational actuator 714. The stage 164 is retracted to allow the dynamic gripper assembly 216 to access the static gripper assembly 166. FIG. 7C is a detail view showing the engagement of grippers 720 of the static and dynamic gripper assemblies 166 and 216. Each gripper 720 has a first end effector 722A and a second end effector 722B. The first end effector 722A has one central protrusion 738 centrally located on the end of the first end effector 722A. The second end effector 722B has two peripheral protrusions 734 peripherally located on the end of the second end effector 722B. The two peripheral protrusions 734 of the second end effector 722B form a slot into which the central protrusion 738 of the first end effector 722A of another gripper 720 may fit. Each of the protrusions 738 and 734 has a notch 726 for engaging an internal edge 728 of a substrate 730. The end effectors 722A and 722B of each gripper 720 are actuated by an actuator 736 that retracts the end effectors 722A and 722B, bringing them closer together for insertion into the central opening 732 of a substrate 730, and then extends the end effectors 722A and 722B apart until the notches 726 of the protrusions 738 and 734 contact the internal edge 728 of the substrate 730. When the grippers 720 of the static and dynamic gripper assemblies 166 and 216 engage, the protrusion 738 of one gripper 720 fits between the protrusions 734 of another gripper 720 inside the central opening 732, allowing transfer of the substrate from one gripper assembly to the other.

The grippers 720 facilitate transfer of substrates from one gripper assembly to another as follows. A first gripper assembly having substrates engaged with grippers 720 as described above is moved into proximity with a second gripper assembly having no substrates. The protrusions 738 and 734 of the first gripper assembly are engaged with internal edges 728 of respective substrates 730, such that the substrates move with the first gripper assembly. The second gripper assembly is positioned such that the grippers 720 of the second gripper assembly face the grippers 720 of the first gripper assembly. The two gripper assemblies are moved toward each other such that the central protrusions 738 of the second gripper assembly fit into the space between the peripheral protrusions 734 of the first gripper assembly inside the central openings 732 of respective substrates, interleaving the protrusions of the first and second gripper assemblies inside the central openings 732 of the respective substrates. The protrusions 738 and 734 of the second gripper assembly are then actuated to engage the internal edges 728 of the respective substrates, moving past the protrusions 738 and 734 of the first gripper assembly, which remain engaged with the internal edges 728. After the protrusions 738 and 734 of the second gripper assembly engage with the internal edges 728 of the respective substrates, the protrusions 738 and 734 of the first gripper assembly are actuated, bringing them closer together to disengage from the internal edges 728 of the respective substrates. At that time, control of the substrates has been transferred to the second gripper assembly from the first gripper assembly. The two gripper assemblies are then actuated to separate for further process.

In this manner, the flipper assembly 108 flips all substrates disposed on a single substrate carrier 120 simultaneously. Multiple carriers 120 may be flipped sequentially by the flipper assembly 108, as described above. In alternate embodiments of a flipper assembly, individual substrates on a substrate carrier 120 may be flipped sequentially using a single-gripper robot as a dynamic gripper. In other embodiments, a portion of the substrates on one carrier may be flipped simultaneously. For example, if substrates are arrayed in a rectangular grid pattern, a gripper head having a linear configuration may be used to flip one "row" of substrates at a time, or a gripper head having a rectangular configuration may flip a portion of the substrates at a time. For large area substrate carriers, a linear gripper head may be supported at both ends of the gripper head and rotated around a longitudinal axis thereof to engage the substrate carrier and a static gripper head, which may also be linear in configuration. The gripper head may move along the substrate carrier to access all substrates thereon, or the substrate carrier may move beneath the linear dynamic gripper head.

In one embodiment, a plurality of substrates 730 is disposed on the grippers 720 of the static gripper assembly 166. The end effectors 722A and 722B of the dynamic gripper assembly 216 are fully retracted, and the dynamic gripper assembly 216 is moved into engagement with the static gripper assembly 166, such that the protrusions 738 of the dynamic gripper assembly 216 mesh with the protrusions 734 of the static gripper assembly 166, and the protrusions 734 of the dynamic gripper assembly 216 mesh with the protrusions 738 of the static gripper assembly 166, in the internal opening 732 of each of the substrates 730. The end effectors 722A and 722B of the dynamic gripper assembly 216 are extended until their notches 726 contact the inner edge 728 of each of the substrates 730. The end effectors 722A and 722B of the static gripper assembly 166 are then retracted, and the dynamic gripper assembly 216 disengages from the static gripper assembly 166, carrying the substrates 730.

Figure 7D:
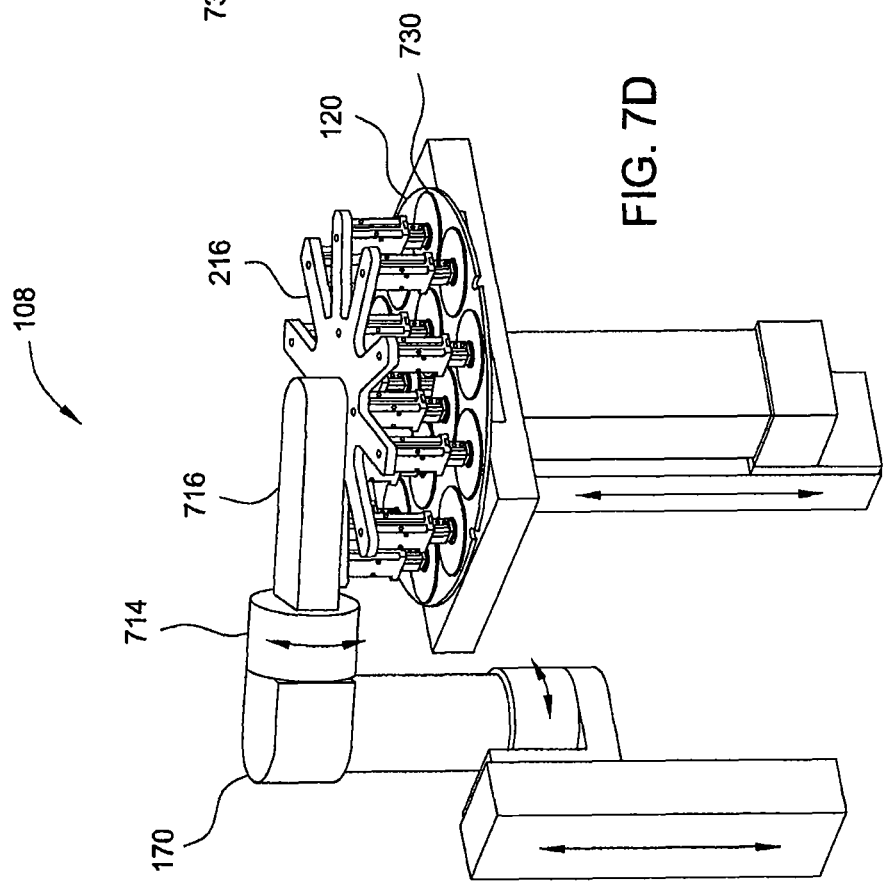

FIG. 7D shows the flipper assembly 108 in a configuration with the dynamic gripper assembly 216 engaging the substrate carrier 120 on the stage 164 to deposit the substrates 730 thereon. The dynamic gripper assembly 216 has flipped the substrates 730 by retrieving the substrates from the static gripper assembly 166 (FIG. 7B), as described above, rotating around an axis substantially parallel to the z-axis to swing out of engagement with the static gripper assembly 166 and the stage 164, and rotating around an axis substantially parallel to the x-y plane of the system 100, by operation of the x-y rotational actuator 714. The protrusions 738 and 734 of the grippers 720 mesh with the grooves 604 of the substrate carrier 120, in much the same fashion as with the grippers 720 of the static gripper assembly 166, to allow placement of the substrates 730 on the substrate carrier 120. The end effectors 722A and 722B then retract to disengage from the internal edge 728 of each substrate 730.

Most structural parts of the substrate handling module 104 may be formed from a structurally strong material, such as metal, for example aluminum or stainless steel. Materials that directly contact substrates, such as contact surfaces of the grippers 720 or the end effectors 144 may be made of a plastic or ceramic material to avoid damage or contamination of the substrates, which may have magnetic metal surfaces.

Figure 8:
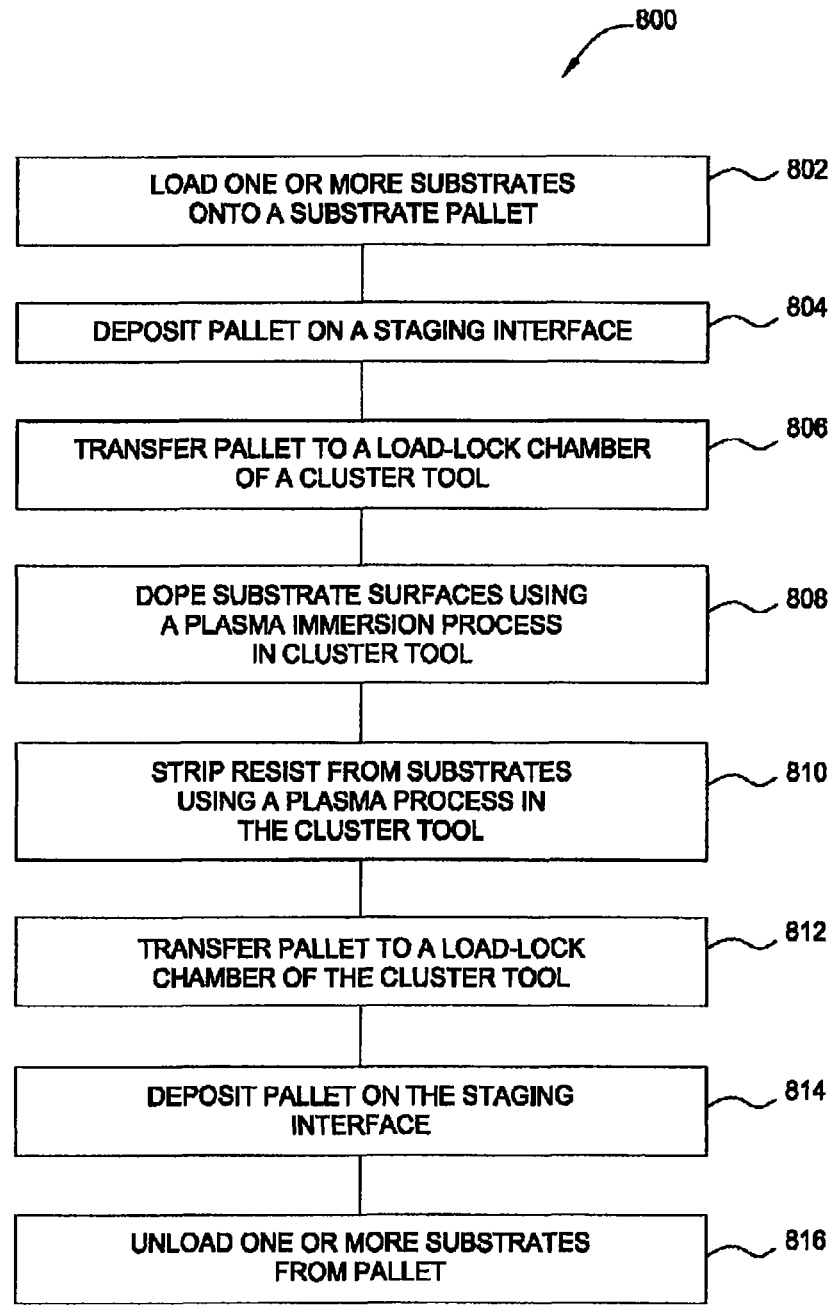
FIG. 8 is a flow diagram summarizing a method according to another embodiment.

FIG. 8 is a flow diagram summarizing a method 800 according to another embodiment. The method 800 may be used to process substrates having magnetic surfaces, for example in a magnetic patterning process. At 802, one or more substrates is loaded onto a substrate pallet, which may be the substrate carrier 120 described elsewhere herein. Any number of substrates may be loaded onto the pallet, depending on the needs of particular embodiments. In one embodiment, fourteen (14) substrates are loaded onto a pallet. Loading the substrates onto the pallet may comprise repeatedly positioning the pallet to receive substrates at respective substrate sites of the pallet. Loading the substrates onto the pallet may also comprise changing an orientation of one or more of the substrates. For example, each substrate may be rotated from a first position to a second position orthogonal to the first position for loading onto the pallet. The first position may be a storage position, in which substrates are closely aligned in coaxial arrangement, while the second position is a processing position, in which substrates are aligned in a planar arrangement.

At 804, the pallet is deposited on a staging interface, which may be the carrier transport module 122 described above. The staging interface positions the pallet for loading and unloading and for delivery to a processing module. The staging interface may have an actuated platform, as described above, for positioning the pallet. The staging interface may move the pallet linearly between a loading or unloading position and a delivery position.

At 806, the pallet is transferred to a load-lock chamber of a cluster tool. The load-lock chamber may be configured to accept a plurality of pallets in some embodiments. In one embodiment, the staging interface may move the pallet linearly in two dimensions to position the pallet for transferring to the load-lock chamber. In another embodiment, a transfer robot may move the pallet in the z-direction (e.g. vertically) to position the pallet for loading into the load-lock chamber. The load-lock chamber equalizes pressure with the processing environment of the cluster tool. The load-lock chamber may also perform any pre-processing of substrates that may be desired, such as degassing, preheating, precooling, and the like.

At 808, the substrates on the pallet are subjected to a plasma immersion process in the cluster tool to dope the surfaces of the substrates. The pallet is retrieved from the load-lock and deposited in a process chamber coupled to the cluster tool. The process chamber may be a P3i chamber, as described above in connection with FIG. 1. Plasma processing of substrates having magnetic surfaces is generally performed at a temperature below about 150° C. to avoid disrupting the magnetic properties of the entire surface. A mask may be used to shield portions of the substrate surface from ions, resulting in a pattern of magnetic properties on the substrate surface. The mask may be a resist material formed on each substrate and patterned according to any desired process, such as lithography, physical patterning, or imprinting.

At 810, a plasma process may be performed, in the same chamber as the doping process, or in a different chamber, to strip the resist material from the substrates. If the stripping process is performed in a different chamber, a transfer robot may access the pallet to move the substrates to the stripping chamber. The doping chamber and the stripping chamber are both coupled to the transfer chamber of the cluster tool in such an embodiment.

At 812, the pallet is transferred to a load-lock chamber of the cluster tool to exit the processing module. At 814, the pallet is retrieved from the load-lock chamber and deposited on the staging interface. At 816, one or more substrates are unloaded from the pallet.

Figure 9:
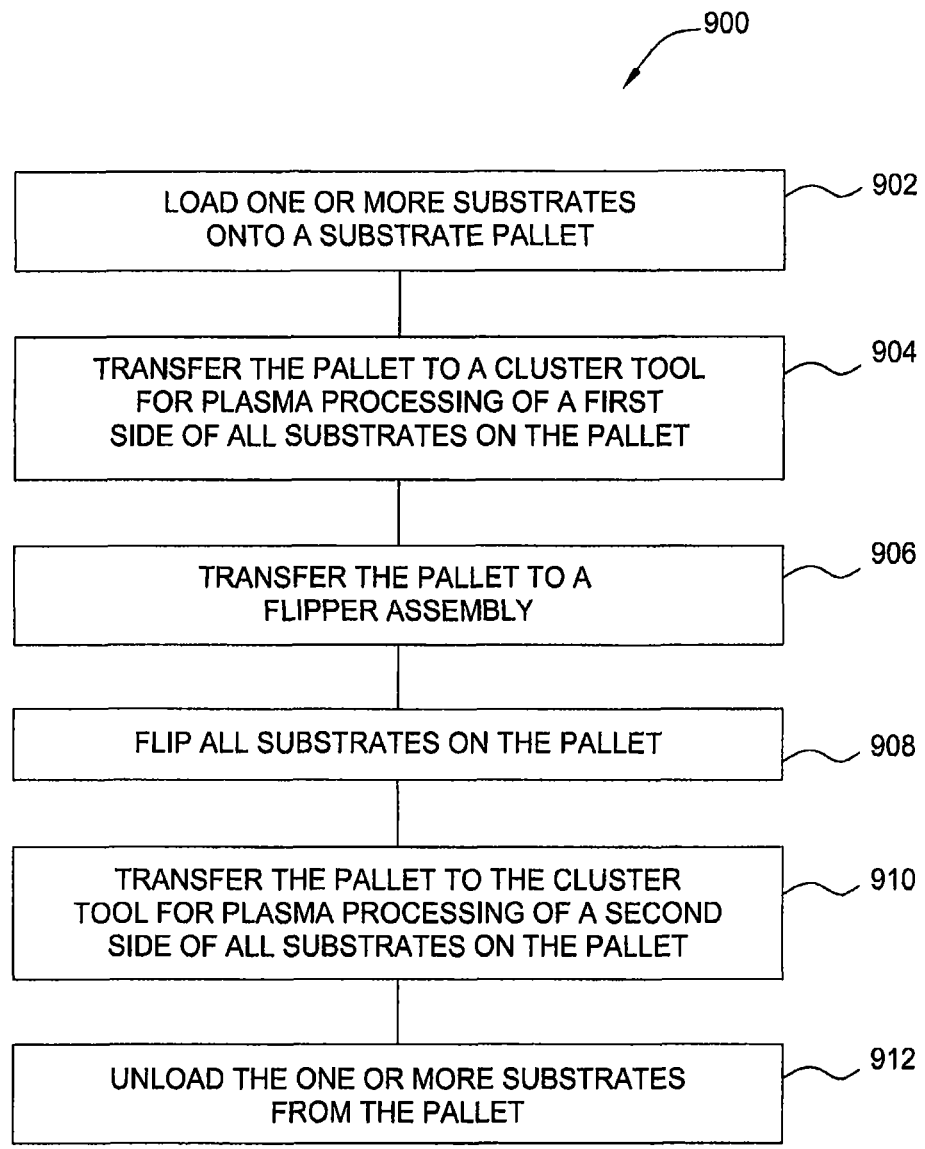
FIG. 9 is a flow diagram summarizing a method according to another embodiment.

FIG. 9 is a flow diagram summarizing a method 900 according to another embodiment. At 902, one or more substrates is loaded onto a substrate pallet. At 904, the substrate pallet is transferred to a cluster tool for plasma processing of a first side of all substrates on the pallet. This operation may be performed in a manner similar to the manner of the method 800 of FIG. 8 using apparatus described elsewhere herein. After processing the first side of all the substrates, the pallet is transferred to a flipper assembly at 906, which may be the flipper assembly 108 described in connection with FIG. 1, or any variants described herein. The substrates are all flipped at 908 to expose a second side of all the substrates, the second side opposite the first side. At 910, the pallet is transferred to the cluster tool for plasma processing of the second side of all the substrates on the pallet. At 912, the substrates are unloaded from the pallet.

In the method of FIG. 9, the plasma processing may include the plasma operations described in connection with FIG. 8. Other plasma operations may also be performed, such as deposition and etching operations.

While the foregoing is directed to embodiments of the invention, other and further embodiments of the invention may be devised without departing from the basic scope thereof.

What is claimed is:

1. A system for processing magnetic media, comprising a substrate handling module, comprising:
   a substrate carrier having a plurality of substrate support locations;
   a loader assembly configured to position a substrate on each substrate support location of the substrate carrier, wherein the loader assembly comprises a cassette station and a first robot comprising an end effector configured to engage an edge of the substrate in a cassette on the cassette station and rotate the substrate between a first orientation and a second orientation orthogonal to the first orientation; and a flipping assembly configured to retrieve the substrates from the substrate carrier, flip them over, and replace them on the substrate carrier, and wherein the flipping assembly comprises:

a stage for positioning one or more substrate to be flipped;

a static gripper head comprising one or more grippers; and a dynamic gripper head comprising one or more grippers, wherein the dynamic gripper head is actuated to flip the substrates simultaneously, wherein each gripper of the static gripper head and the dynamic gripper head includes a first end effector and a second end effector, wherein the first end effector has a central protrusion and the second end effector has two peripheral protrusions, wherein the central protrusion of the first end effector of a gripper of the one or more grippers of the dynamic gripper head is adapted to fit between the two peripheral protrusions of the second end effector of a corresponding gripper of the one or more grippers of the static gripper head, and the central protrusion of the first end effector of the gripper of the one or more grippers of the dynamic gripper head and the peripheral protrusions of the second end effector of the gripper of the one or more grippers of the static gripper head are configured to concurrently engage an inside edge of an annular substrate by extending the first and second end effectors substantially horizontally so the protrusions are in contact with the inside edge.

2. The system of claim 1, further comprising a substrate processing module, comprising:

a plurality of plasma processing chambers configured to process substrates on the substrate carrier;

a transfer chamber configured to transport the substrate carrier loaded with substrates; and a load-lock chamber for transporting the loaded substrate carrier into and out of the substrate processing module.

3. The system of claim 2, further comprising a stage configured to hold the loaded substrate carrier.

4. The system of claim 3, wherein the loader assembly comprises a carrier transfer module configured to transport the substrate carrier to and from a carrier loading module, and a staging robot configured to transport a loaded substrate carrier between the stage, the carrier loading module, and the flipping assembly.

5. The system of claim 4, wherein the stage comprises an entry stage and an exit stage, and the carrier transfer module comprises an entry module and an exit module.

6. The system of claim 1, wherein the end effector of the loader assembly comprises at least two fingers, each finger having a substrate contact point and an actuator for moving the substrate contact point of the finger into contact with the edge of the substrate.

7. The system of claim 1, wherein the first robot further comprises an arm with a first end coupled to an actuator and a second end coupled to the end effector.

8. The system of claim 7, wherein the actuator rotates the robot arm about two orthogonal axes.

9. The system of claim 1, wherein the dynamic gripper head is actuated to move from an engaged position between the static gripper head and the stage to a non-engaged position leaving the space between the static gripper head and the stage clear.

10. The system of claim 9, wherein the stage is actuated to engage the static gripper head.

11. The system of claim 10, wherein the dynamic gripper head is actuated to engage the stage and the static gripper head.

12. The system of claim 3, further comprising a factory interface coupled to the loader assembly and the flipping assembly, wherein the factory interface comprises a second robot configured to retrieve the loaded substrate carrier from the stage and transport it to the load-lock chamber.

* * * * *